US009305952B2

(12) United States Patent
Lenchenkov et al.

(10) Patent No.: US 9,305,952 B2
(45) Date of Patent: Apr. 5, 2016

(54) IMAGE SENSORS WITH INTER-PIXEL LIGHT BLOCKING STRUCTURES

(71) Applicant: SEMICONDUCTOR COMPONENTS INDUSTRIES, LLC, Phoenix, AZ (US)

(72) Inventors: Victor Lenchenkov, Sunnyvale, CA (US); Xianmin Yi, Menlo Park, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 18 days.

(21) Appl. No.: 14/469,498

(22) Filed: Aug. 26, 2014

(65) Prior Publication Data

US 2015/0062392 A1    Mar. 5, 2015

Related U.S. Application Data

(60) Provisional application No. 61/870,414, filed on Aug. 27, 2013.

(51) Int. Cl.
H01L 27/146  (2006.01)
H01L 31/0216  (2014.01)
H04N 5/369  (2011.01)

(52) U.S. Cl.
CPC ...... *H01L 27/14623* (2013.01); *H01L 27/1462* (2013.01); *H01L 27/14629* (2013.01); *H01L 31/02164* (2013.01); *H01L 31/02168* (2013.01); *H04N 5/369* (2013.01); *H01L 27/1463* (2013.01); *H01L 27/14627* (2013.01); *H01L 27/14636* (2013.01); *H01L 31/02162* (2013.01)

(58) Field of Classification Search
None
See application file for complete search history.

(56) References Cited

U.S. PATENT DOCUMENTS

| 5,432,363 | A | 7/1995 | Kamisaka et al. | |
|---|---|---|---|---|
| 7,453,131 | B2 | 11/2008 | Marshall et al. | |
| 7,935,994 | B2 | 5/2011 | Wang et al. | |
| 8,383,440 | B2 | 2/2013 | Wang et al. | |
| 2010/0164031 | A1* | 7/2010 | Shin | H01L 27/14623 257/432 |
| 2012/0049305 | A1* | 3/2012 | Takami | H01L 27/14623 257/432 |
| 2013/0292548 | A1 | 11/2013 | Agranov et al. | |
| 2014/0077283 | A1 | 3/2014 | Lenchenkov | |
| 2015/0295002 | A1* | 10/2015 | Kang | H01L 27/14623 257/432 |

OTHER PUBLICATIONS

Lenchenkov et al., U.S. Appl. No. 14/464,408, filed Aug. 20, 2014.

\* cited by examiner

*Primary Examiner* — Justin P Misleh
(74) *Attorney, Agent, or Firm* — Treyz Law Group, P.C.; Jason Tsai; Joseph F. Guihan

(57) ABSTRACT

An image sensor with an array of image sensor pixels is provided. Each pixel may include a photodiode and associated pixel circuits formed in a semiconductor substrate. Buried light shields may be formed on the substrate to present pixel circuitry that is formed in the substrate between two adjacent photodiodes from being exposed to incoming light. Metal interconnect muting structures may be formed over the buried light shields. In one embodiment, light blocking structures may be formed to completely seal the interconnect routing structures. The light blocking structures may be formed on top of the buried light shields or on the surface of the substrate. In another embodiment, planar light blocking structures that are parallel to the surface of the substrate may be formed between metal routing layers to help absorb stray light. Light blocking structures formed in these ways can help reduce optical crosstalk and enhance global shutter efficiency.

12 Claims, 7 Drawing Sheets

IMAGE SENSORS WITH INTER-PIXEL LIGHT BLOCKING STRUCTURES

This application claims the benefit of provisional patent application No. 61/870,414, filed Aug. 27, 2013, which is hereby incorporated by reference herein in its entirety.

BACKGROUND

This relates generally to image sensors, and more specifically, to image sensors with buried light shields.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

A dielectric stack is formed on the substrate over the photodiodes. The dielectric stack includes metal routing lines and metal vias formed in dielectric material. Light guides are often formed in the dielectric stack to guide the trajectory of incoming light. A color filter array is typically formed over the dielectric stack to provide each pixel with sensitivity to a certain range of wavelengths. Microlenses are formed over the color filter array. Light enters the microlenses and travels through the color filters into the dielectric stack.

In a conventional image sensor configured to operate in global shutter mode, each image sensor pixel includes a photodiode for detecting incoming light and a separate storage diode for temporarily storing charge. The storage diode should not be exposed to incoming light. In such arrangements, structures such as tungsten buried light shields (abbreviated as WBLS) are formed on the substrate between neighboring photodiodes to help prevent stray light from affecting the storage diode. At least some metal vias are formed through gaps in the buried light shields in order to control pixel transistors formed between two adjacent photodiodes. Shielding storage diodes in this way can help reduce crosstalk and increase global shutter efficiency (i.e., the buried light shields are designed to prevent stray light from entering regions of the substrate located between two adjacent photodiodes).

In practice, however, the tungsten buried light shield reflects stray light. The reflected stray light may then strike nearby metal routing structures and be scattered back towards the substrate, through the existing gaps in the buried light shield, and corrupt the storage diode. This results in undesirable pixel crosstalk and degraded global shutter efficiency.

It would therefore be desirable to be able to provide image sensors with improved inter-pixel shielding arrangements.

DETAILED DESCRIPTION

Embodiments of the present invention relate to image sensors, and more particularly, to image sensors with buried light shield structures with antireflective coating. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an Image. The image sensors may include arrays of imaging pixels. The pixels in the image sensors may include photosensitive dements such as photodiodes that convert the incoming light into image signals. Image sensors may have any number of pixels (e.g., hundreds or thousands or pixels or more). A typical image sensor may, for example, have hundreds of thousands or millions of pixels (e.g. megapixels). Image sensors may include control circuitry such as circuitry for operating the imaging pixels and readout circuitry for reading out image signals corresponding to the electric charge generated by the photosensitive elements.

Figure 1:
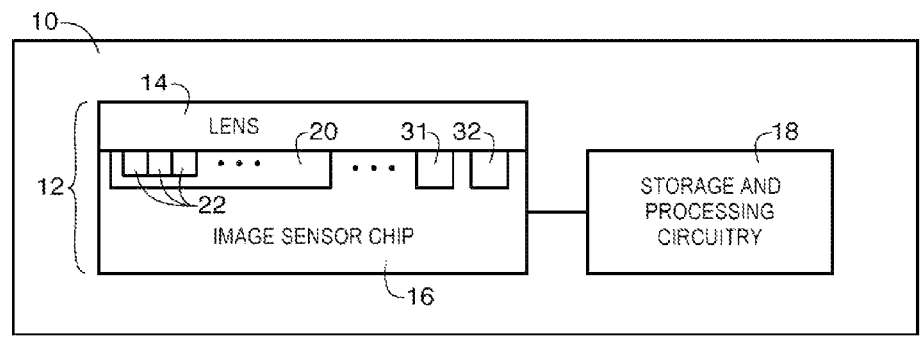
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a backside illumination image sensor. If desired, camera module 12 may be provided With an array of lenses 14 and an array of corresponding image sensors 16.

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Embodiments of the present invention relate to image sensor pixels configured to support global shutter operation. For example, the image pixels may each include a photodiode, floating diffusion region, and a local storage region. With a global shutter scheme, all of the pixels in an image sensor are reset simultaneously. The transfer operation is then used to simultaneously transfer the charge collected in the photodiode of each image pixel to the associated storage region. Data from each storage region may then be read out on a per-row basis.

Figure 2:
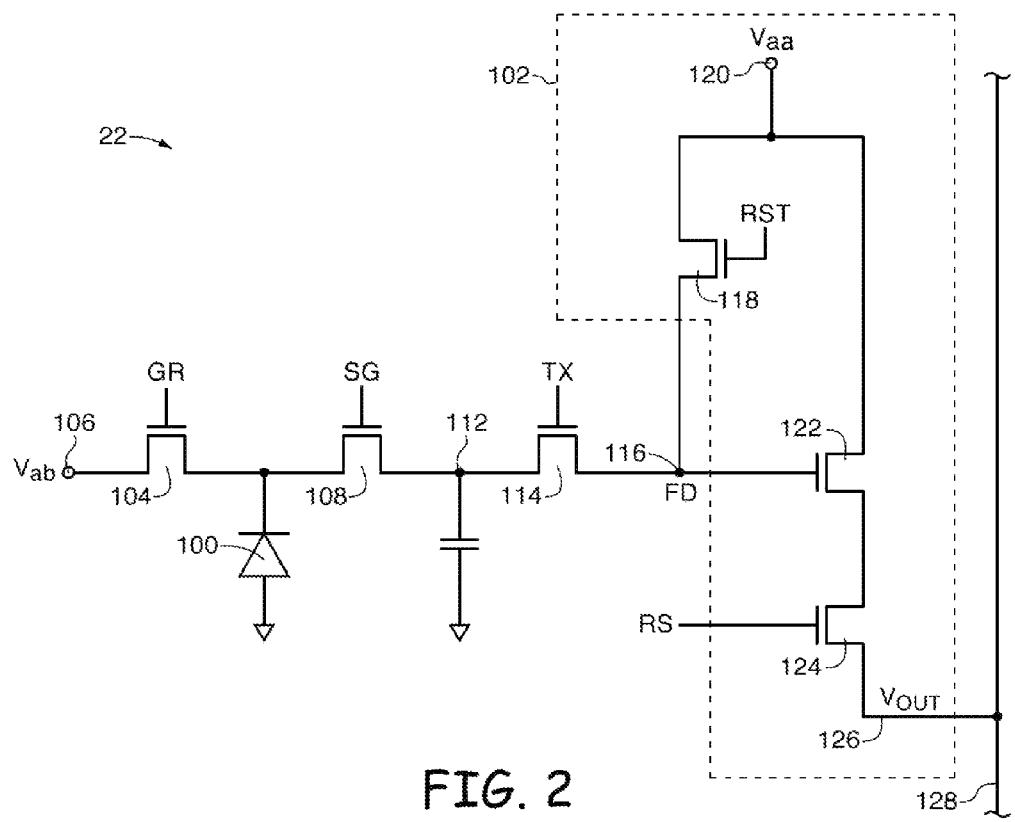
FIG. 2 is a diagram of an illustrative image sensor pixel that may be used to support global shutter operation in accordance with an embodiment of the present invention.

FIG. 2 is a circuit diagram of an illustrative image sensor pixel 22 operable in global shutter mode. As shown in FIG. 2, pixel 22 may include a photosensitive element such as photodiode 100. A first (positive) power supply voltage Vaa ma be supplied at positive power supply terminal 120. A second power supply voltage Vab may be supplied at second power supply terminal 106. Incoming light may be collected by photodiode 100. Photodiode 100 may then generate charge (e.g., electrons) in response to receiving impinging photons. The amount of charge that is collected by photodiode 100 may depend on the intensity of the impinging light and the exposure duration (or integration time).

Before an image is acquired, reset control signal RST may be asserted. Asserting signal RST turns on reset transistor 118 and resets charge storage node 116 (also referred to as floating diffusion region FD) to Vaa. Reset control signal RST may then be deasserted to turn off reset transistor 118. Similarly, prior to charge integration, a global reset signal GR may be pulsed high to reset photodiode 100 to power supply voltage Vab (e.g., by passing Vab to photodiode 100 through global reset transistor 104).

Pixel 22 may further include as storage transistor 108 operable to transfer charge from photodiode 100 to storage node (sometimes called a charge storage region or storage region) 112. Charge storage region 112 may be a doped semiconductor region (e.g., a doped silicon region formed in a silicon substrate by ion implantation, impurity diffusion, or other doping techniques) that is capable of temporarily storing charge transferred from photodiode 100. Region 112 that is capable of temporarily storing transferred charge is sometimes referred to as a "storage diode" (SD).

Pixel 22 may include a transfer gate (transistor) 114. Transfer gate 114 may have a gate terminal that is controlled by transfer control signal TX. Transfer signal TX may be pulsed high to transfer charge from storage diode region 112 to charge storage region 116 (sometimes called a floating diffusion region). Floating diffusion (FD) region 116 may be a doped semiconductor region (e.g., a region in a silicon substrate that is doped by ion implantation, impurity diffusion, or other doping processes). Floating diffusion region 116 may serve as another storage region for storing, charge during image data gathering operations.

Pixel 22 may also include readout circuitry such as charge readout circuit 102. Charge readout circuit 102 may include row-select transistor 124 and source-follower transistor 122. Transistor 124 may have a gate that is controlled by row select signal RS. When signal RS is asserted, transistor 124 is turned on and a corresponding signal Vout (e.g. an output signal having a magnitude that is proportional to the amount of charge at floating diffusion node 116), is passed onto output path 128.

Image pixel array 20 may include pixels 22 arranged in rows and columns. A column readout path such as output line 128 may be associated with each column of pixels (e.g., each image pixel 22 in a column may be coupled to output line 128 through respective row-select transistors 124). Signal RS may be asserted to read out signal Vout from a selected image pixel onto column readout path 124. Image data Vout may be fed to processing circuitry 18 for further processing. The circuitry of FIG. 2 is merely illustrative. If desired, pixel 22 may include other pixel circuitry.

Figure 3:
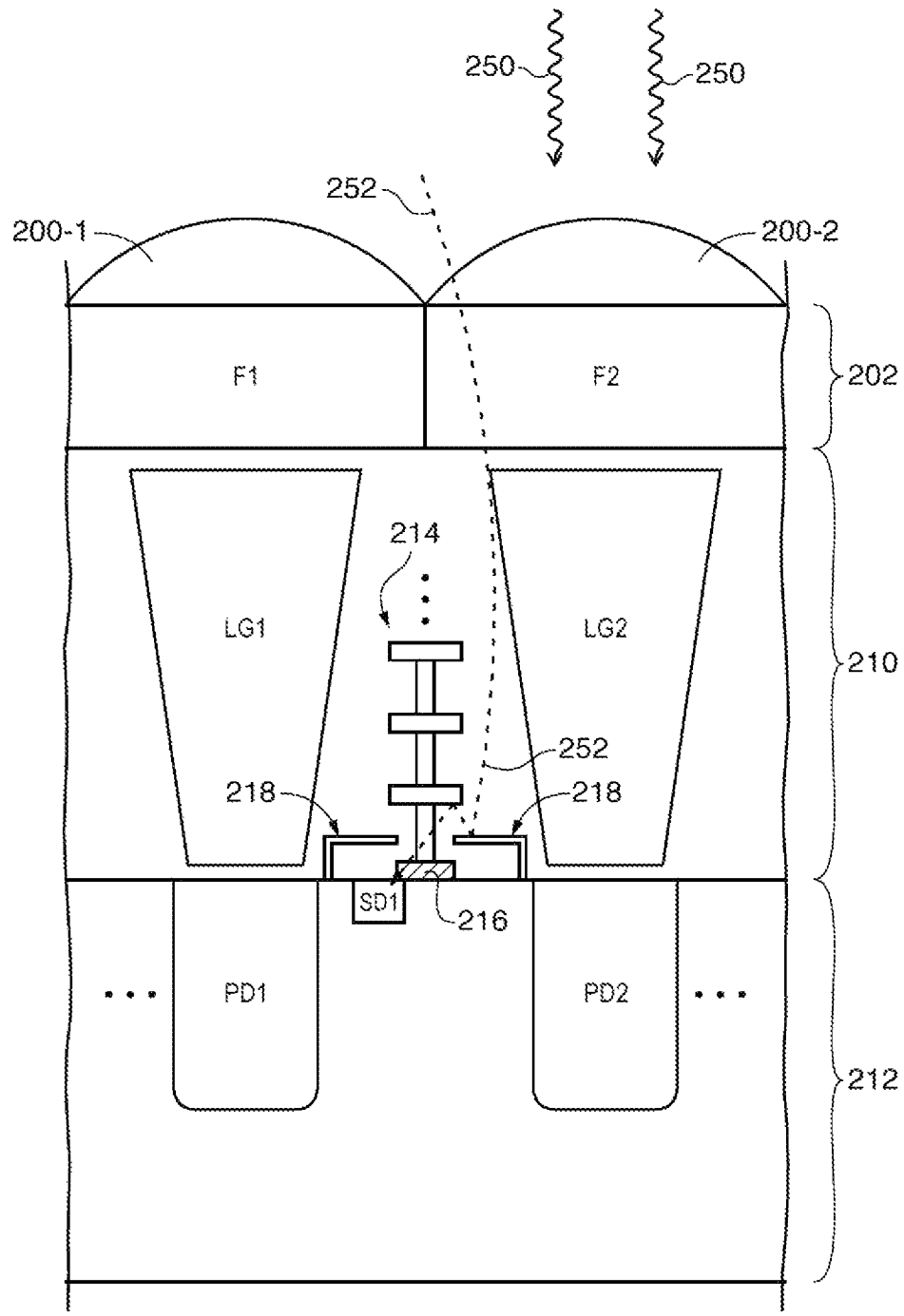
FIG. 3 is a cross-sectional side view of a conventional image sensor with reflective buried light shields.

FIG. 3 is a cross-sectional side view showing two adjacent conventional image sensor pixels operable in global shutter mode. As shown in FIG. 3, photodiode PD1 that is part of a first image sensor pixel and photodiode PD2 that is part of a second image sensor pixel are formed in a p-type substrate 212. Circuitry such as a storage diode SD1 and a storage gate conductor 216 (i.e., a gate conductor of the storage transistor) that is associated with the first image pixel may be formed on substrate 212 between photodiodes PD1 and PD2.

A dielectric stack 210 is formed on substrate 212. A first light guide LG1 for directing incoming light towards PD1 is formed above PD1 in dielectric stack 210. A second light guide LG2 for directing incoming light towards PD2 is formed above PD2 in dielectric stack 210. Metal interconnect routing paths 214 are formed in dielectric stack 210 between light guides LG1 and LG2. At least some metal routing path makes contact with storage gate conductor 216 for controlling the storage transistor.

A color filter array 202 is formed over dielectric stack 210. In particular, a first color filter element F1 is formed on stack 210 directly above PD1, whereas a second color filter element F2 is formed on stack 210 directly above PD2. First filter element F1 may be configured to pass green light, whereas second filter element F2 may be configured to pass red light. A first microlens 200-1 that is configured to focus light towards PD1 can be formed on first filter element F1, whereas a second microlens 200-2 that is configured to focus light towards PD2 can be formed on second filter element F2.

Ideally, incoming light 250 enters microlenses 200-1 and 200-2 hoot above and is directed towards the corresponding photodiodes. For example, light entering microlens 200-1 should be directed towards PD1. whereas light entering microlens 200-2 should be directed towards PD2. In practice, however, stray light may potentially strike regions on substrate 212 between adjacent photodiodes and result in undesired crosstalk and reduction in global shutter efficiency (i.e., stray light may undesirably affect the amount of charge in storage diode region SD1). Regions on substrate 212 where light should not be allowed to strike may be referred to as "dark" regions.

In an effort to prevent stray light from entering the dark regions, tungsten buried light shields 218 are formed to partially cover the dark regions (i.e., light shields 218 are designed to shield SD1 and storage gate 216). There may be gaps in the buried light shields through which interconnects 214 are formed to make contact with circuitry in the dark regions. These gaps are therefore sometimes referred to as a "buried light shield contact window."

Tungsten buried light shields 218 are reflective. In practice, stray light may reflect off the tungsten buried light shields 218; the reflected light may strike nearby interconnect routing structures 214 and be scattered through the gaps in the light shields into the dark regions (as indicated by path 252). Even though the tungsten buried light shields help to reduce crosstalk, stray light can still be inadvertently scattered into the dark regions on substrate 212. It may therefore be desirable to provide improved ways for shielding the dark regions.

Figure 4:
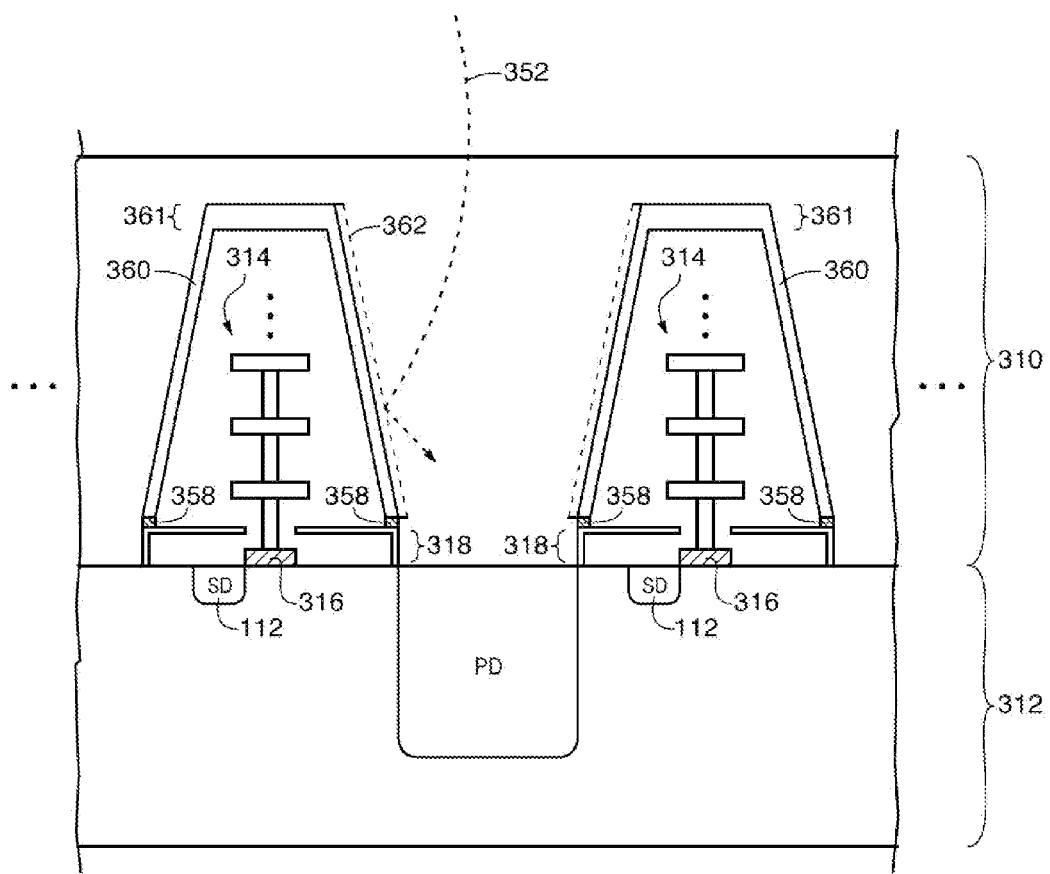
FIG. 4 is a cross-sectional side view of an illustrative image sensor with metal interconnect sealing structures formed on buried light shields in accordance with an embodiment of the present invention.

In accordance with an embodiment of the present invention, image sensor pixels may be provided with lighting blocking structures for completely sealing the metal interconnect routing structures. FIG. 4 shows a photosensitive element such as a photodiode PD formed in a semiconductor substrate such as substrate 312 (e.g., a p-type semiconductor substrate). Pixel circuitry such as storage diodes 112, storage gate conductors 316 (e.g., a gate conductor associated with storage transistor 108 or other control transistor in pixel 22), floating diffusion region FD, and other pixel structures may be formed in substrate 312 adjacent to photodiode PD.

A dielectric stack such as dielectric stack 310 may be burned on substrate 312. Dielectric stack 310 may be formed from dielectric material such as silicon oxide. Interconnect routing structures 314 (e.g., conductive signal routing paths and conductive vias) may be formed in dielectric stack 310. Dielectric stack 310 may therefore sometimes be referred to as an interconnect stack. In general, dielectric stack 310 may include alternating metal routing layers (e.g., dielectric layers in which metal routing paths are formed) and via layers (e.g., dielectric layers in which conductive vias coupling conductive structures from one adjacent metal routing layer to corresponding conductive structures in another adjacent metal routing layer). In general, interconnect routing structures 314 ma be formed over regions of substrate 312 that are not occupied by photodiodes to avoid unnecessary blocking light that is intended for each photodiode. If desired, light guide structures may optionally be formed over each photodiode to help direct incoming light towards a corresponding photodiode. In general, color filter array structures and microlens array structures (not shown) may be formed over dielectric stack 310.

Light shielding structures such as buried light shielding (BLS) structures 318 may be formed on substrate 312 to prevent stray light from entering regions on substrate 312 located between adjacent photodiodes (e.g., structures 318 may be configured to prevent pixel structures such as storage diode region 112 from being exposed to incoming light). Buried light shielding structures 318 may be formed from tungsten, copper, gold, silver, aluminum, or other suitable conductive material.

As described above in connection with FIG. 3, buried light shielding structures 318 by themselves are sometimes not entirely sufficient to prevent stray light from entering undesired regions of the substrate. In accordance with an embodiment, light blocking structures 360 may be formed on buried light shielding structures 318 to completely seal metal interconnect routing structures 314. In general, light blocking structures 360 may be formed from metal (e.g., aluminum, copper, tungsten, silver, gold, or other suitable metal) or opaque materials.

As shown in FIG. 4, structures 360 may have side walls that are connected to buried light shields 318 via a conductive ring 358 and may have a top portion 361 that is formed from a metal plate in a metal routing layer in dielectric stack 310. Light blocking structure 360 may, as an example, have a 3-dimensional conical shape that completely seals metal routing structures 314 (e.g., metal routing structures 314 is formed within the interior cavity of the conical light blocking structure 360). Sealed in this way, it may not be possible for incoming light 352 to ever reach storage diode 312 through buried light shields 318. This is merely illustrative. Light blocking structures 360 may be formed in a cylindrical shape, a rectangular prism, or other suitable geometric shapes. Light blocking structures 360 configured in this as may therefore sometimes be referred to herein as metal interconnect sealing structures.

if desired, a layer of antireflective coating (ARC) material 362 may be formed on the side walls of metal interconnect sealing structures 360 to help minimize any reflection off the surface of structures 360. The use of light sealing structures 360 and ARC material 362 can help reduce optical pixel crosstalk and increase global shutter efficiency.

Figure 5:
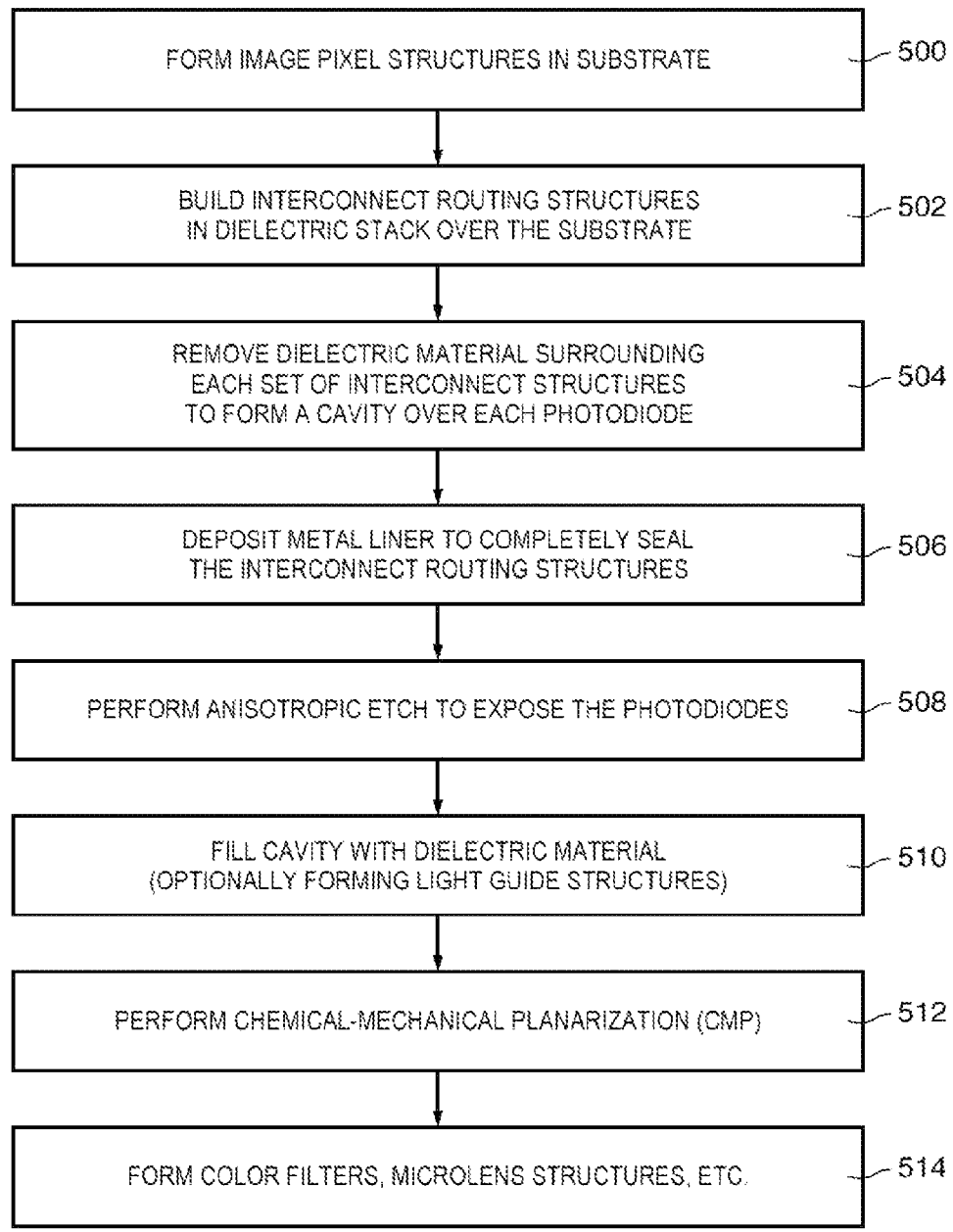
FIG. 5 is a flow chart of illustrative steps for forming the metal interconnect sealing structures of FIG. 4 in accordance with an embodiment of the present invention.

FIG. 5 is a flow chart of illustrative steps involved in forming the pixel circuitry of FIG. 4. At step 500, image pixel structures such as conductive gate structures and associated diffusion regions (e.g., photodiode diffusion regions, global shutter storage diode regions, floating diffusion regions, and other active doped regions) may be formed in a semiconductor substrate. At step 502, metal interconnect routing structures may be formed in a dielectric stack on the semiconductor substrate.

At step 504, a portion of the dielectric material that surrounds each set of interconnect routing structures may be selectively removed to form a cavity over each photodiode region. At step 506, a metal liner may he deposited to form the side walls of the metal interconnect sealing structures. If buried light shields are used a conductive ring may first be deposited on the buried light shields prior to forming the metal liner. At step 508, an anisotropic etch may be performed to remove the metal liner that lies over the photodiodes to expose the photodiodes.

At step 510, the cavity may then be filled with dielectric material. While forming the dielectric material, light guide structures may optionally be formed over each photodiode. Thereafter, the top portion of metal interconnect sealing structures may be formed to completely seal the metal interconnect routing structures.

At step 512, chemical-mechanical polishing (CMP) operations may be performed to planarize the top surface of dielectric stack 310. At step 514, other pixel structures such as a color filter array and a microlens arras may subsequently be formed over the dielectric stack. Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Figure 6:
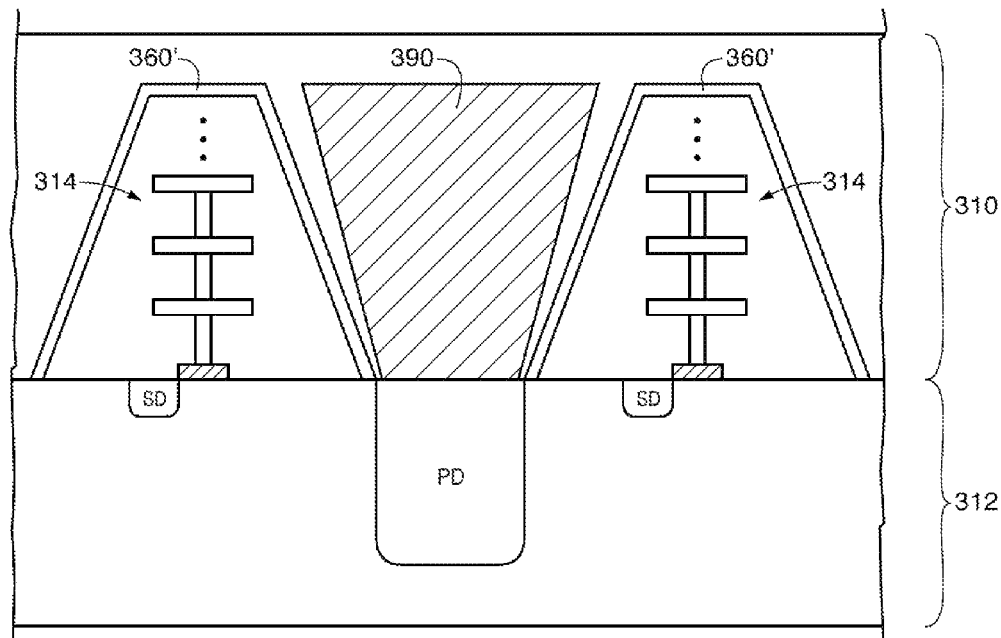
FIG. 6 is a cross-sectional side view of an illustrative image sensor with metal interconnect sealing structures formed on a semiconductor substrate in accordance with an embodiment of the present invention.

The arrangement of FIG. 4 in which light blocking structures 360 are formed on the buried light shields is merely illustrative and does not serve to limit the scope of the present invention. If desired, the light block structures need not be formed on buried light shields. FIG. 6 shows another suitable arrangement in which the 3-dimensional metal interconnect sealing structures such as structures 360' are formed on substrate 312 without the use of buried light shields. As shown in FIG. 6, since buried light shields are used sealing structures 360' may indirectly contact the surface of substrate 312 without the need of forming any conductive rings. In the example of FIG. 6, a light guide 390 may be formed between etch adjacent pair of metal interconnect sealing structures 360'.

Figure 7:
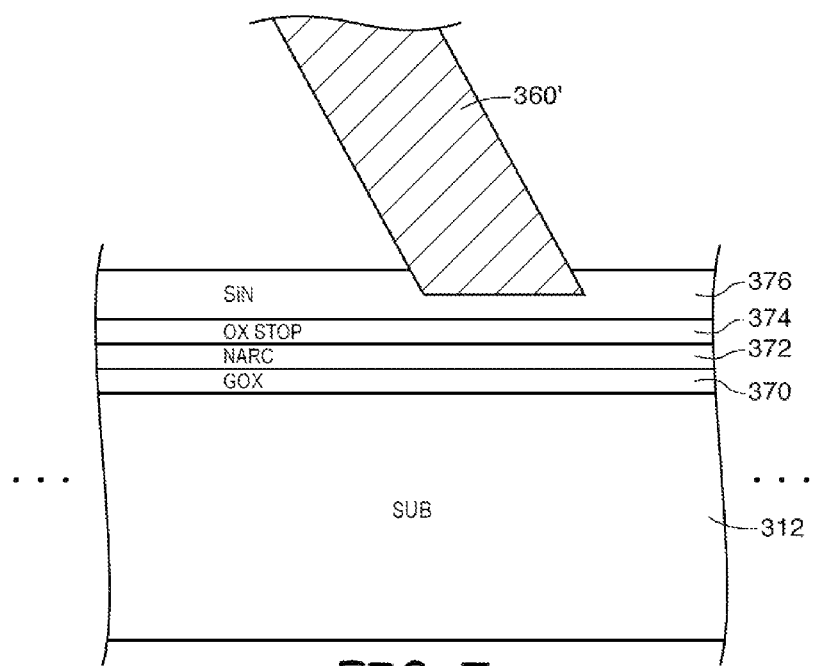
FIG. 7 is a detailed view showing how the metal interconnect sealing structures of FIG. 6 can be formed directly on a nitride stop layer in accordance with an embodiment of the present invention.

FIG. 7 is a detailed view showing how the metal interconnect sealing structures of FIG. 6 can be formed on the surface of substrate 312. As shown in FIG. 7, a gate oxide (GOX) layer such as layer 370 may be formed at the surface of substrate 312, a nitride antireflective coating (NARC) layer such as layer 372 may be formed on gate oxide layer 370, an oxide etch stop layer such as layer 374 may be formed on ARC layer 372, and a silicon nitride layer 376 may be formed on oxide stop layer 374. In general, any suitable type of ARC layer may be used for layer 372, and any suitable type of nitride stop layer can be used for layer 376.

As an example, nitride layer 376 may be 45 nm thick, whereas oxide stop layer 374 may be 15 nm thick. In general, layer 376 may have a thickness that is greater than that of layer 374. As shown in FIG. 7, the side wall of sealing structure 360' may protrude partially into nitride layer 376. If desired, light guide structures such as light guide structures 390 of FIG. 6 may also protrude partially into layer 376.

Figure 8:
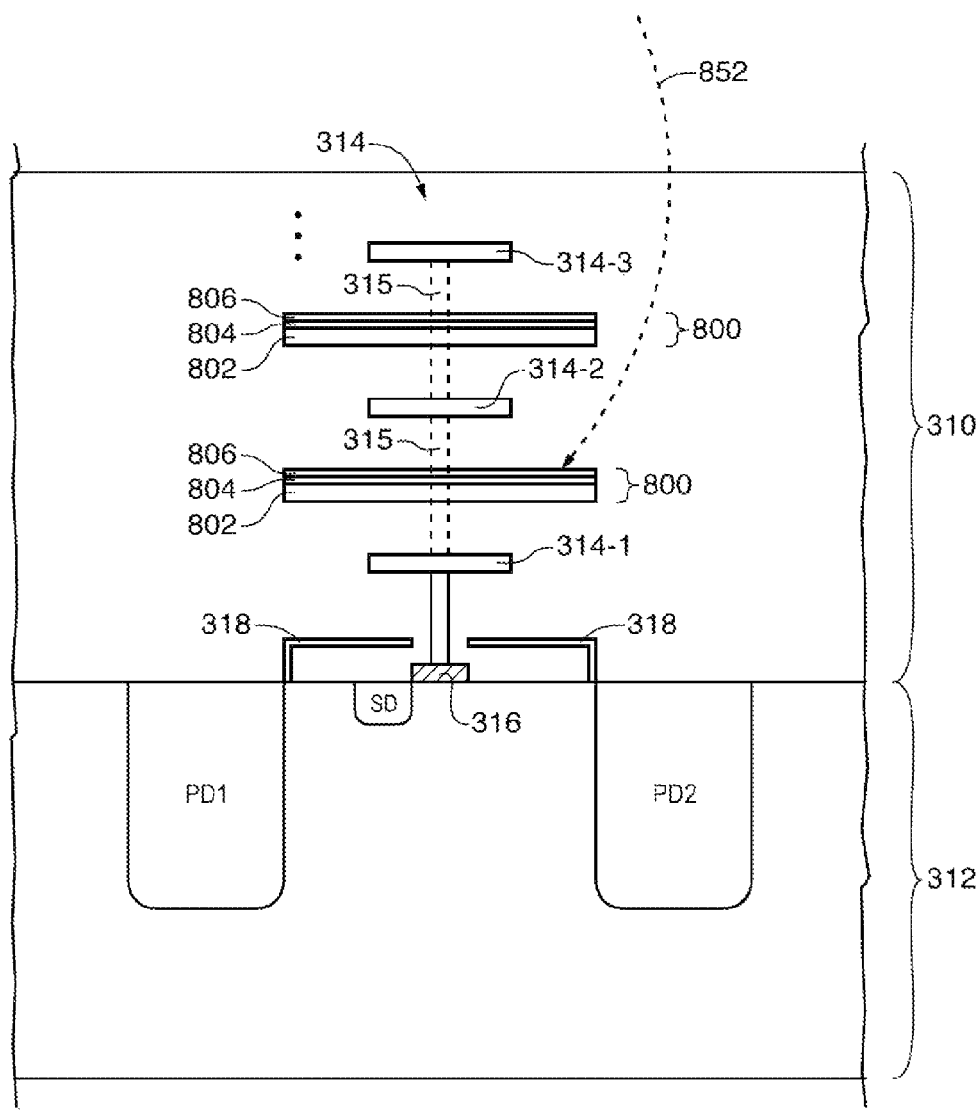
FIG. 8 is a cross-sectional side view of an illustrative image sensor with intermetal light blocking layers in accordance with an embodiment of the present invention.

FIG. 8 shows another suitable arrangement in which intermetal light blocking structures such as blocking structures 800 are inserted in between existing metal routing layers in the dielectric stack 310. Structures 800 may be electrically floating and may not be actively coupled to other pixel circuitry. As shown in FIG. 8, interconnect routing structures 314 may be coupled to storage gate conductor 316 through a window in buried light shields 318. In particular, a metal routing path 314-1 may be formed in a first metal routing layer (M1) in dielectric stack 310, metal routing path 314-2 may be formed in a second metal routing laser (M2) in dielectric stack 310, and metal routing path 314-3 may be formed in a third metal routing layer (M3) in dielectric stack 310.

At least one intermetal light blocking structure 800 may be interposed between the M1 and M2 metal routing layers. In the example of FIG. 8, structure 800 may include a metal layer 802 (e.g., a layer formed from aluminum, copper, silver, gold, or other suitable metals), a nitride layer 804 formed on metal layer 802, and a photoresist layer 806 formed on nitride layer 804. Layer 804 may be formed from tantalum, titanium, silicon, oxide, a combination of these materials, or other suitable materials exhibiting high optical absorption. Formed in this way, layers 804 and 806 may serve collectively as an absorptive antireflective coating layer that can absorb and prevent any stray light 852 from penetrating into undesired regions of substrate 312.

In the example of FIG. 8, intermetal light blocking structures 800 may have a width that is as wide as the buried light shields. If desired, structures 800 may have smaller widths. If desired, another intermetal light blocking structure 800 may be formed between other metal routing layers (see, FIG. 8, a second structure 800 interposed between M2 and M3) to further help reduce pixel crosstalk and increase global shutter efficiency. The intermetal light blocking structures 800 may have holes through which conductive vias 315 can penetrate so that metal routing paths from one layer can connect with metal routing paths of another layer. Structures 800 may therefore be electrically floating and not electrically connected to any transistor in the image sensor. Alternatively, structures 800 may be coupled to a power supply terminal (e.g., to a positive power supply terminal or a ground power supply terminal).

The embodiment described thus far relates to image sensors operating in global shutter mode. If desired, the embodiments of the present invention can also be applied to image sensors operating in rolling shutter mode to help reduce optical pixel cross-talk.

Figure 9:
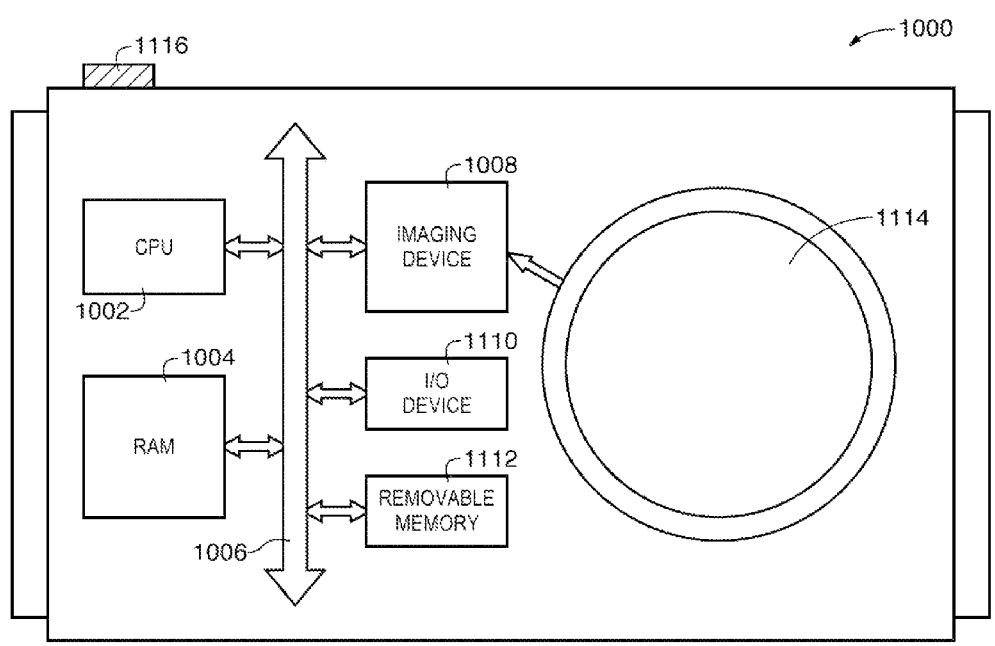
FIG. 9 is a block diagram of a processor system that may employ some of the embodiments of FIGS. 4-8 in accordance with an embodiment of the present invention.

FIG. 9 is a simplified diagram of an illustrative processor system 1000, such as a digital camera, which includes an imaging device 1008 (e.g., the camera module of FIG. 1) employing an imager having pixels with light blocking structures as described above. Without being limiting, such a system could include a computer system, still or video camera system, scanner, machine vision system vehicle navigation system, video phone, surveillance system, auto focus system, star tracker system, motion detection system, image stabilization system, and other systems employing on imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it ma be one or more busses, bridges or other communication paths used to interconnect system components of system 1000.

Various embodiments have been described illustrating imaging systems with buried light shield structures. A system may include an image sensor module with an array of image sensor pixels and one or more lenses that focus light onto the array of image sensor pixels (e.g., image pixels arranged in rows and columns).

In accordance with an embodiment, an image sensor pixel may include at least a photodiode formed in a semiconductor substrate, a storage diode formed in the substrate, a floating diffusion region formed in the substrate, a storage transistor coupled between the photodiode and the storage diode, a charge transfer transistor coupled between the storage diode and the floating diffusion region, a reset transistor, a source follower transistor, and a row select transistor.

A dielectric stack may be formed over the substrate. Metal interconnect routing structures may be formed in the dielectric stack over regions in the substrate that separate adjacent photodiodes. The dielectric stack may also include light blocking structures that help prevent stray light from reaching the metal interconnect routing layers. The use of light blocking structures can help reduce pixel crosstalk and improve global shutter efficiency.

In one suitable arrangement, the light blocking structures may be configured to completely seal the interconnect routing structures. Antireflective material may optionally be formed on the light blocking structures. The light blocking structures may be formed on buried light shielding structures via a conductive ring or directly on a nitride layer formed on the surface of the substrate. The light blocking structure of this type may have a conical shape (as an example).

In another suitable arrangement, the light blocking structures may include a planar metal layer that is parallel to the surface of the substrate and optically absorptive material formed on the planar metal layer. The optically absorptive material may include tantalum, titanium, nitride, silicon, oxide, a combination of these materials, or other suitably absorptive material. Photoresist material may also be formed on the planar metal layer to further reduce reflectivity of the light blocking structures. In general, light blocking structures of this type may be formed over buried light shielding structures and may have substantially similar widths is the buried light shielding structures.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
a substrate;
a photosensitive element formed in the substrate;
a dielectric stack formed over the substrate;
interconnect routing structures formed in the dielectric stack;
light blocking structures that are formed in the dielectric stack and that completely seal the interconnect routing structures;
a gate conductor formed on the substrate; and
a buried light shield formed on the substrate, wherein the buried light shield has a window through which a via is formed to connect the gate conductor to the interconnect routing structures, and wherein the light blocking structures are formed on the buried light shield.

2. The image sensor defined in claim 1, wherein the light blocking structures have a conical shape.

3. The image sensor defined in claim 1, further comprising:
antireflective material formed on the light blocking structures.

4. The image sensor defined in claim 1, further comprising:
a conductive ring interposed between the buried light shield and the light blocking structure.

5. A system, comprising:
a central processing unit;
memory;
a lens;
input-output circuitry; and
an imaging device, wherein the imaging device comprises:
a substrate;
first and second neighboring photodiodes formed in the substrate;
a dielectric stack formed over the substrate;
metal interconnect routing structures formed in the dielectric stack over a region in the substrate that separates the first and second neighboring photodiodes;
light blocking structures that prevent light from reaching the metal interconnect routing structures; and
buried light shielding structures, wherein the light blocking structures are formed on the buried light shielding structures.

6. The system defined in claim 5, wherein the light blocking structures completely surround and seal the metal interconnect routing structures.

7. The system defined in claim 5, wherein the buried light shielding structures comprise tungsten buried light shielding structures.

8. The system defined in claim 7, wherein the light blocking structures are connected to the tungsten buried light shielding structures with a conductive ring.

9. An image sensor, comprising:
a substrate;
a photosensitive element formed in the substrate;
a dielectric stack formed over the substrate;
interconnect routing structures formed in the dielectric stack;
light blocking structures that are formed in the dielectric stack and that surround the interconnect routing structures, wherein the light blocking structures prevent light from reaching the interconnect routing structures; and
a buried light shield formed on the substrate, wherein the light blocking structures are formed on the buried light shield.

10. The image sensor defined in claim 9, wherein the buried light shield comprises tungsten.

11. The image sensor defined in claim 9, further comprising:
a conductive ring interposed between the buried light shield and the light blocking structures.

12. The image sensor defined in claim 11, wherein the conductive ring is in direct contact with the buried light shield and the light blocking structures.

* * * * *